United States Patent
Tsai et al.

(10) Patent No.: US 6,303,491 B1
(45) Date of Patent: Oct. 16, 2001

(54) METHOD FOR FABRICATING SELF-ALIGNED CONTACT HOLE

(75) Inventors: Tzu-Ching Tsai, Taichung Hsien; Lin-Chin Su, Taipei Hsien; Jengping Lin, Taoyuan Hsien; Tse Yao Huang, Taipei, all of (TW)

(73) Assignee: Nan Ya Technology Corporation (TW)

( * ) Notice: Subject to any disclaimer, the term of this patent is extended or adjusted under 35 U.S.C. 154(b) by 0 days.

(21) Appl. No.: 09/283,984

(22) Filed: Apr. 2, 1999

(30) Foreign Application Priority Data

Feb. 2, 1999 (TW) ................................. 88101583

(51) Int. Cl.[7] ................... H01L 21/4763; H01L 21/8238

(52) U.S. Cl. ..................... 438/639; 438/233; 438/303; 438/622; 438/595; 438/696; 438/700

(58) Field of Search ...................... 438/638, 637, 438/624, 639, 640, 700, 701, 634, 304, 595, 636, 199, 233, 229, 694, 696, 299, 303

(56) References Cited

U.S. PATENT DOCUMENTS

| | | | |
|---|---|---|---|
| 5,728,595 | * 3/1998 | Fukase | 438/241 |
| 5,863,820 | * 1/1999 | Huang | 438/241 |
| 6,001,541 | * 12/1999 | Iyer | 430/322 |
| 6,043,116 | * 3/2000 | Kuo | 438/233 |

* cited by examiner

Primary Examiner—Charles Bowers
Assistant Examiner—Thanhha Pham
(74) Attorney, Agent, or Firm—George T. Marcou; Kilpatrick Stockton LLP

(57) ABSTRACT

A method for fabricating a self-aligned contact hole in accordance with the present invention is disclosed. First a conductive layer, a silicon oxide layer, and a first silicon nitride layer are formed on a silicon substrate. Next, the first silicon nitride layer, the silicon oxide layer, and the conductive layer are etched to form a trench. Then, a BPSG layer is formed over the first silicon nitride layer. A photoresist layer having an opening is defined. Then, using the photoresist layer as the masking layer, a part of BPSG layer is etched to form a self-aligned hole. Next, the photoresist layer is removed. Afterward, a second silicon nitride layer is formed and etched back to form a spacer.

15 Claims, 9 Drawing Sheets

METHOD FOR FABRICATING SELF-ALIGNED CONTACT HOLE

BACKGROUND OF THE INVENTION

1. Field of the Invention

The present invention relates to a method for fabricating semiconductor devices, and more particularly to a method for fabricating a self-aligned contact hole suitable for dynamic random access memory cells (DRAM).

2. Description of the Prior Art

Referring to FIGS. 1A through 1I, the cross-sectional side views of a conventional method for fabricating a self-aligned contact hole are depicted in sequence.

Referring now to FIG. 1A, a cross-sectional view of the first step is schematically shown. In FIG. 1A, a polysilicon layer 14, a polycide layer 16, a silicon nitride 18, and a silicon oxide 20 are sequentially formed by chemical vapor deposition on a silicon substrate 10 having a conductive region 12, for example a source/drain region. The silicon nitride layer 18 has a thickness of approximately 2000 Angstroms, and the silicon oxide layer 20 has a thickness of approximately 500 Angstroms.

Next, as shown in FIG. 1B, the silicon oxide layer 20 and silicon nitride layer 18 are etched to expose the upper surface of the polycide layer 16.

Then, as shown in FIGS. 1B and 1C, using the remainder silicon oxide layer 20 and the silicon nitride layer 18 as the etching mask, the polycide layer 16 and the polysilicon layer 14 are etched by anisotropic etching to form a trench 21 which exposes the conductive region 12.

Referring now to FIG. 1D, a silicon nitride layer 22 is deposited on the bottom and sidewall of the trench 21 by chemical vapor deposition.

As shown in FIG. 1E, the silicon nitride layer 22 is etched back to form a first nitride spacer 22a thereby exposing the conductive region 12. At the same time, the silicon oxide layer 20 is removed.

Referring now to FIG. 1F, a borophosphosilicate glass (BPSG) layer 24 is filled into the trench 21, extending the upper surface of the silicon nitride layer 18. Then, a photoresist layer 26 is formed in a predetermined position by using photolithography process.

Next, as shown in FIGS. 1F and 1G, a part of the BPSG layer filled in the trench 21 is removed using the photoresist layer 26 as the etching mask, thereby forming a self-aligned contact hole 27 which exposes the conductive region 12. Afterward, the photoresist layer 26 is removed. In order to completely expose the conductive region 12, a part of the first nitride spacer 22a and the silicon nitride layer 18 would be removed too.

Afterwards, referring to FIGS. 1G and 1I, a silicon nitride layer 28 is formed by chemical vapor deposition. Then, the silicon nitride layer 28 is etched back to form a second nitride spacer 28a, thereby achieving a better insulating effect.

However, the conventional self-aligned contact hole process suffers from problems. For example, the narrow slit of trench 21 containing first nitride spacer 22a can cause the etching step of silicon nitride layer 28 to stop (as shown in FIGS. 1H and 1I).

Moreover, in order to serve as the etching stop layer, the silicon nitride layer 28 must have a larger thickness, for example 2000 Angstroms. Therefore, the thermal budget will be increased.

SUMMARY OF THE INVENTION

In view of the above disadvantages, an object of the invention is to provide a new method for fabricating a self-aligned contact hole.

The above object is attained by providing a method for fabricating a self-aligned contact hole comprising the steps of: (a) sequentially forming a conductive layer, a silicon oxide layer, and a first silicon nitride layer on a semiconductor substrate having a conductive region; (b) selectively etching said first silicon nitride layer, said silicon oxide layer, and said conductive layer to from a trench, thereby exposing said conductive region; (c) forming an oxide layer over said first silicon nitride layer, said oxide layer filling into said trench; (d) defining a photoresist layer which has an opening in a predetermined position; (e) removing said oxide layer filled into said trench to form a self-aligned contact hole by using said photoresist layer as the masking layer; (f) removing the photoresist layer; and (g) forming a silicon nitride spacer on the sidewall of said self-aligned contact hole.

An aspect of the invention is to provide a method for fabricating a self-aligned contact hole in which said oxide layer in step (c) is a borophosphosilicate glass (BPSG) layer. Furthermore, the first silicon nitride layer has a thickness of somewhere between 400 and 900 Angstroms, preferably between 500 and 600 Angstroms.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through 2G of the drawings.

Figure 1A:
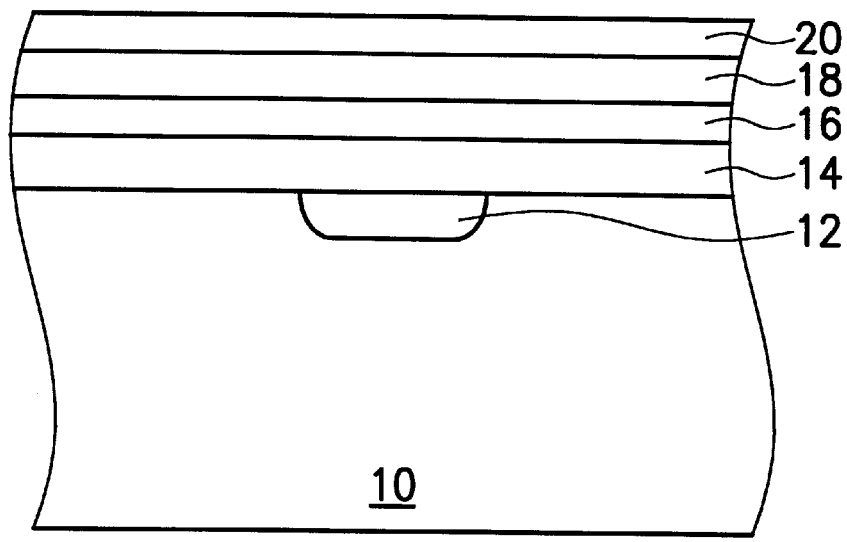
FIGS. 1A through 1I are cross-sectional side views showing the manufacturing steps of a self-aligned contact hole of the prior art.
Figure 1B:
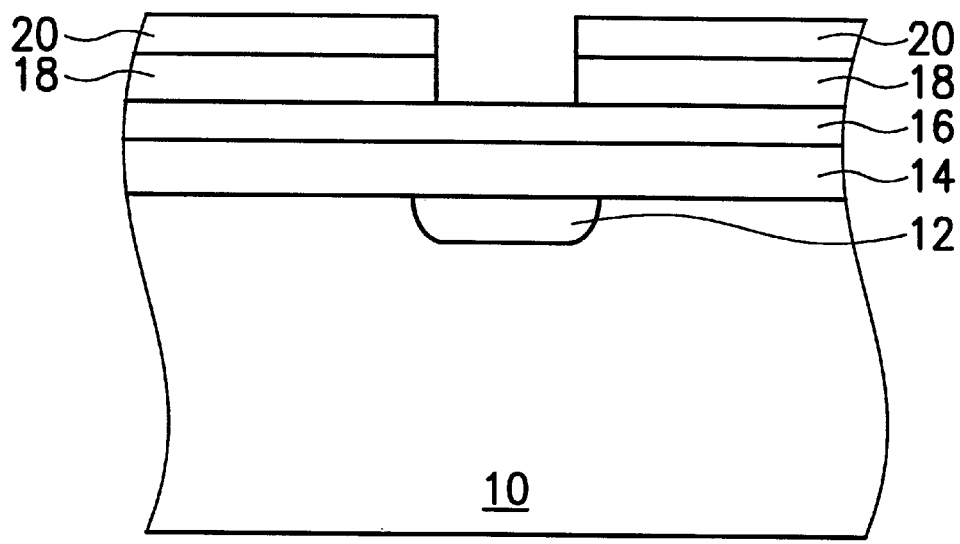
Figure 1C:
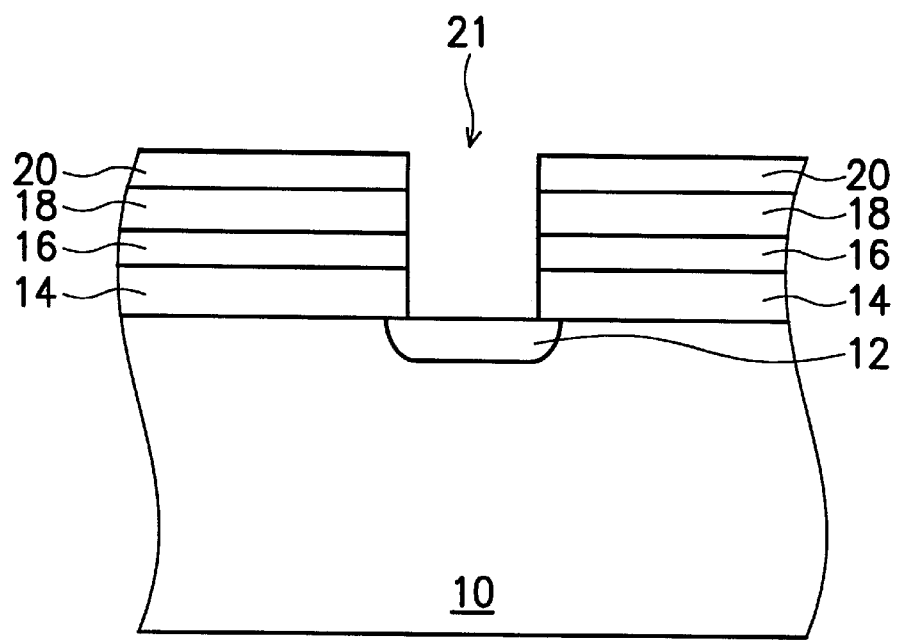
Figure 1D:
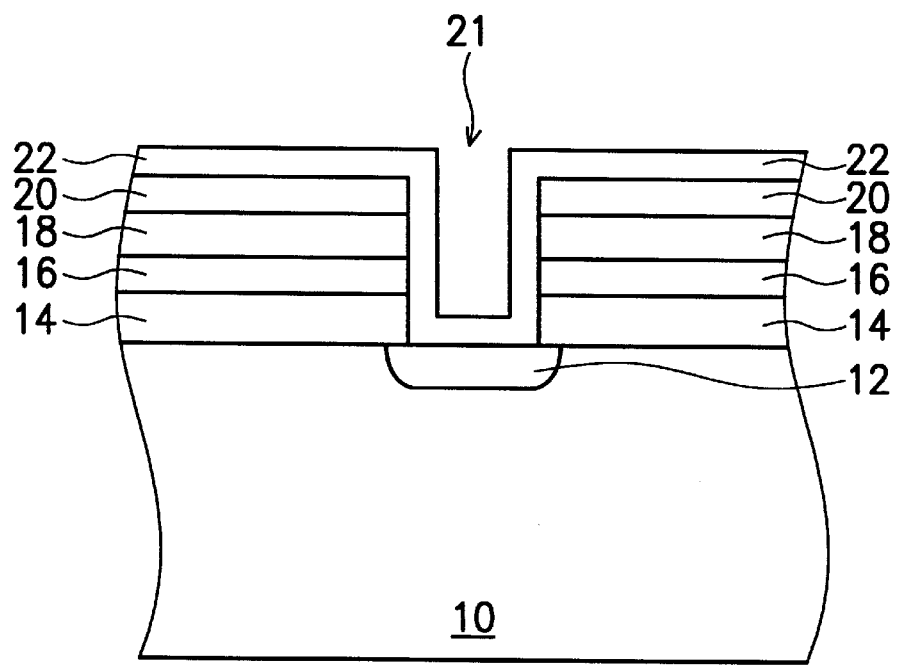
Figure 1E:
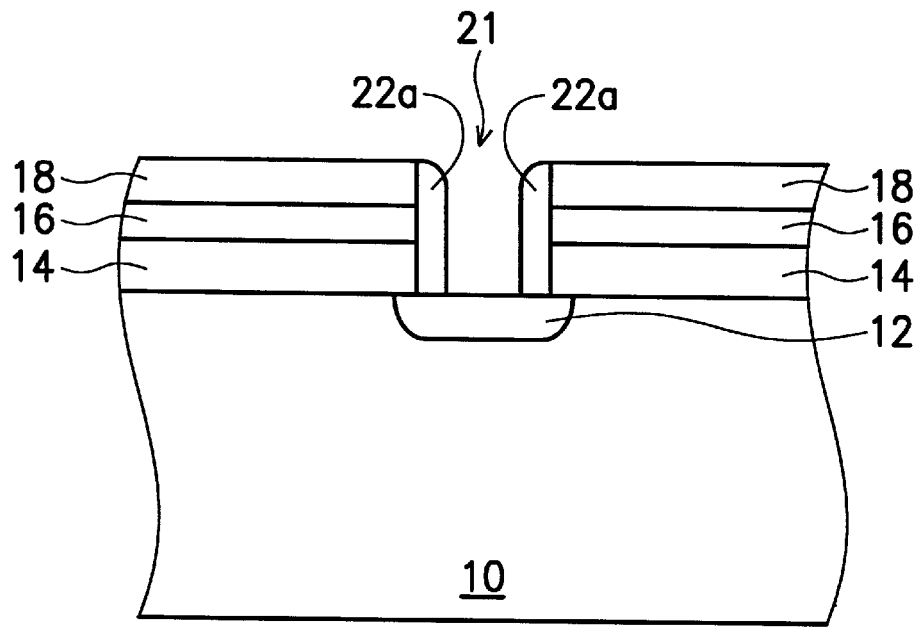
Figure 1F:
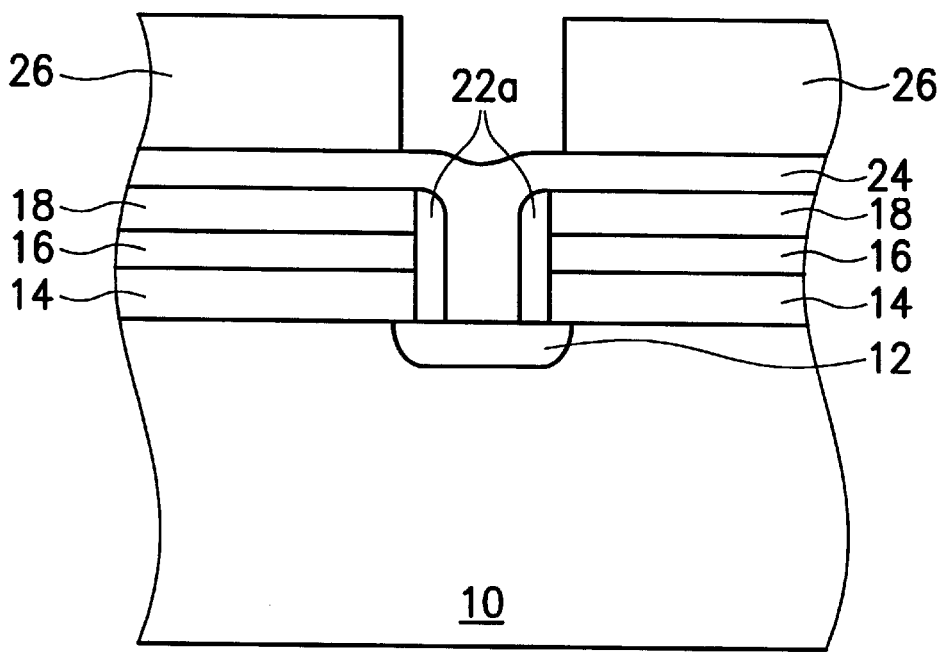
Figure 1G:
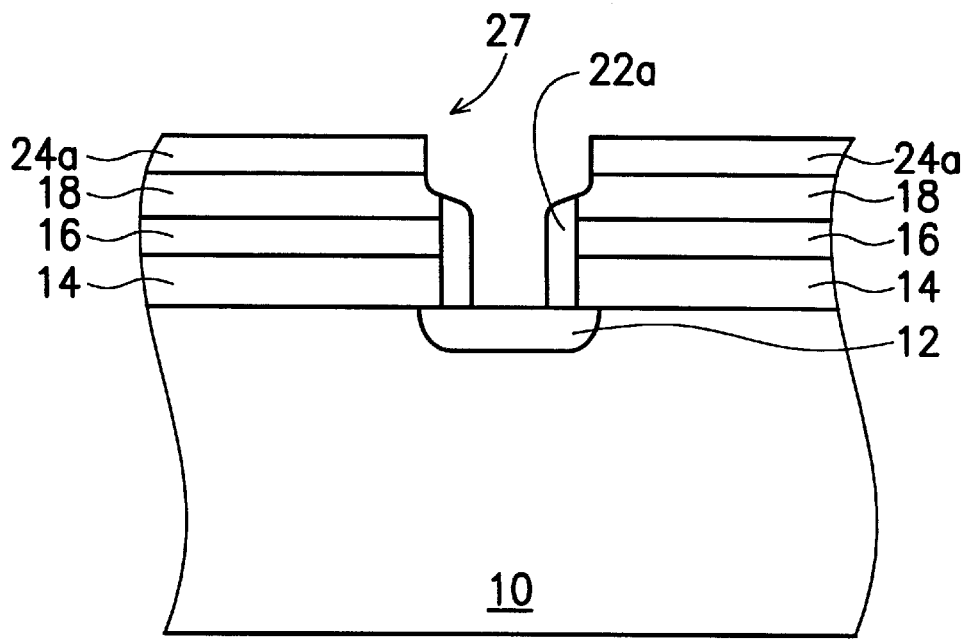
Figure 1H:
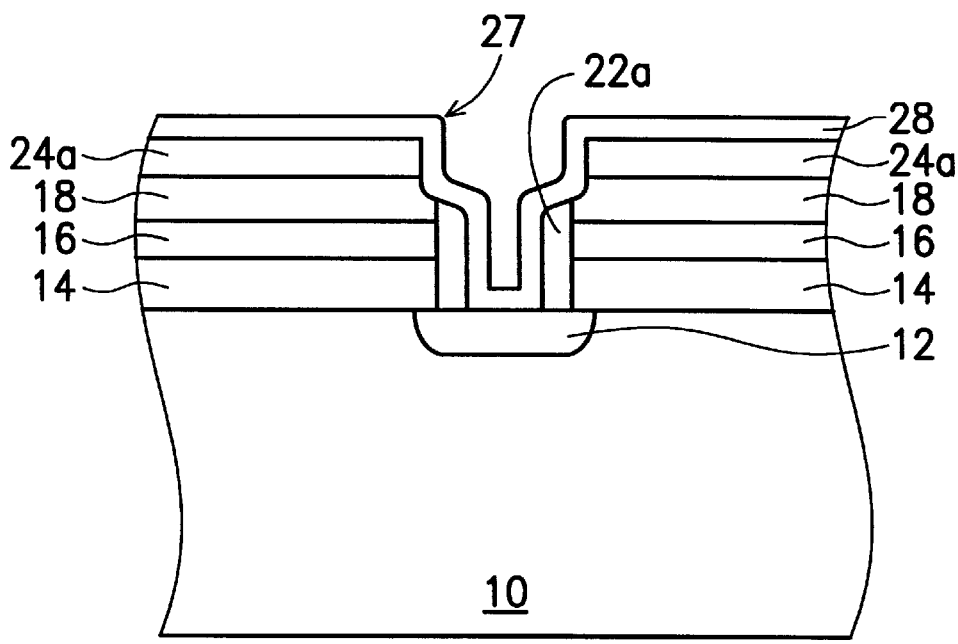
Figure 1I:
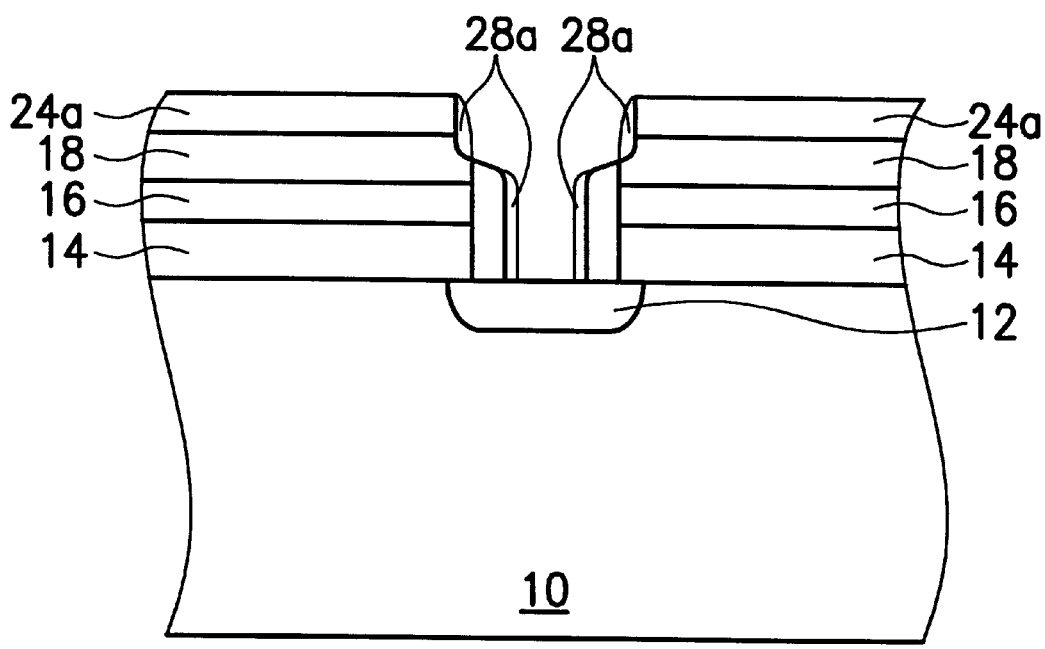
Figure 2A:
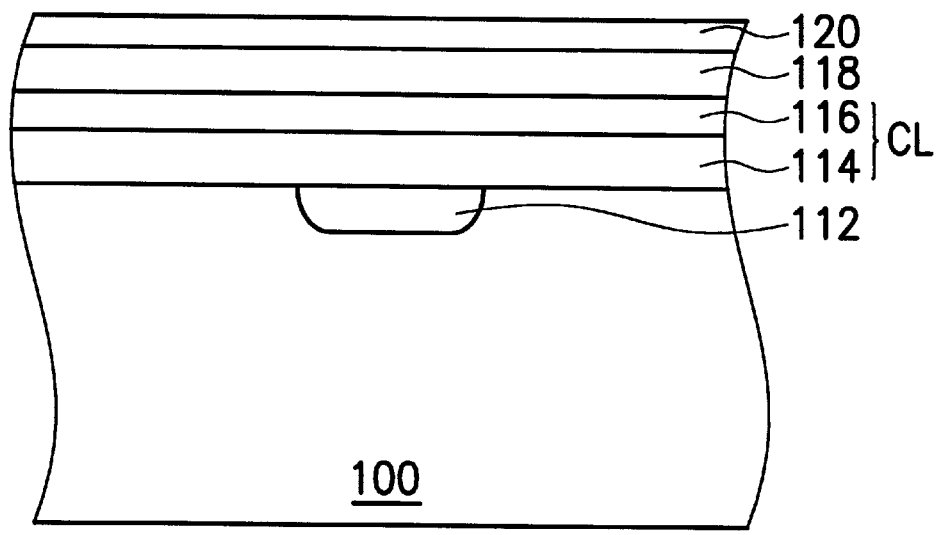
FIGS. 2A through 2G are cross-sectional side views showing the manufacturing steps of a self-aligned contact hole of the invention.

Referring now to FIG. 2A, a cross-sectional view of the starting step is schematically shown. In FIG. 2A, a conductive layer CL, a silicon oxide layer 118, and a first silicon nitride layer 120 are sequentially formed on a semiconductor substrate 100 having a conductive region 112, for example a source/drain region. The semiconductor substrate 100 is preferably a single crystal silicon substrate. The conductive layer CL, consisting of a polysilicon layer and a polycide layer, is used as a gate electrode. The first silicon nitride layer 120 has a thickness of approximately 400 to 900 Angstroms, preferably 500 to 600 Angstroms.

Figure 2B:
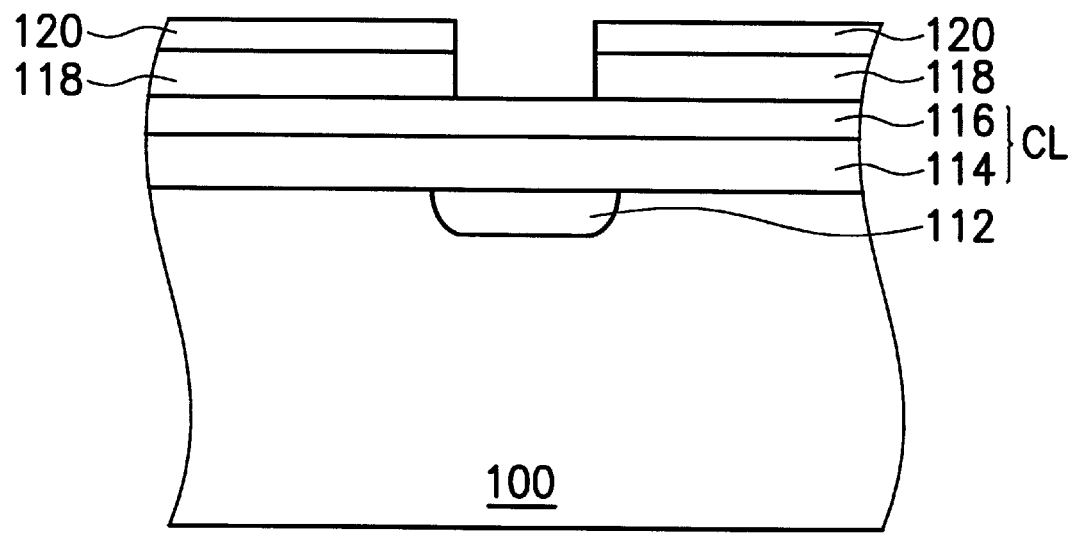

Next, as shown in FIG. 2B, using a photoresist layer (not shown) as an etching mask, the first silicon nitride layer 120 and the silicon oxide layer 118 are etched to expose the upper surface of the conductive layer CL. Then, the photoresist layer is removed.

Figure 2C:
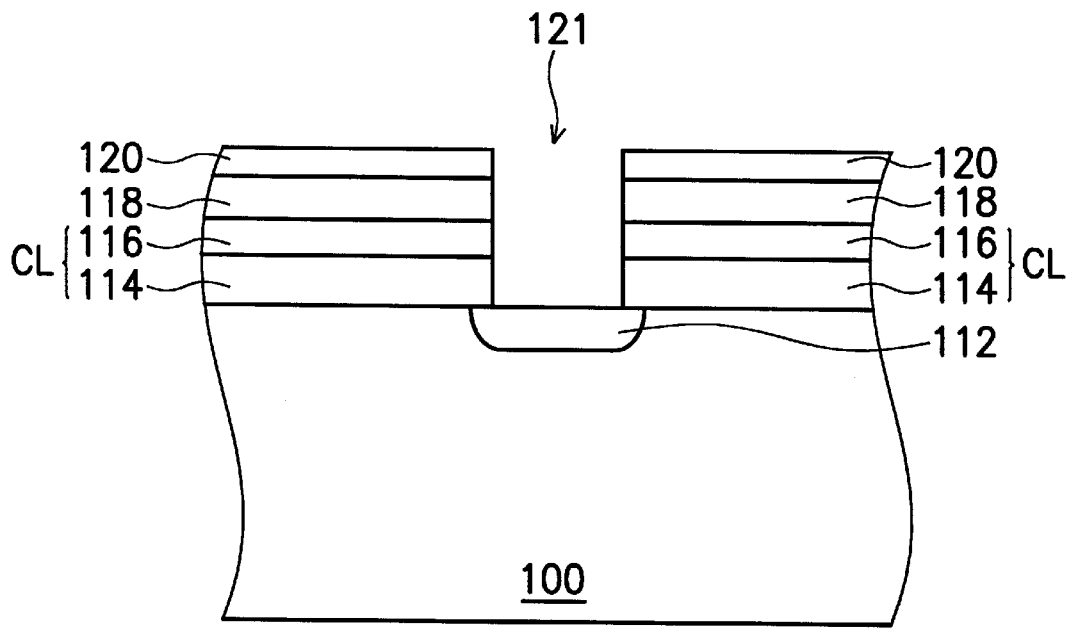

Then, as shown in FIGS. 2B and 2C, using the remainder of the first silicon nitride layer 120 and the silicon oxide layer 118 as the etching mask, the polycide layer 116 and the polysilicon layer 114 are etched by anisotropic etching to form a trench 121 exposing the conductive region 112.

Figure 2D:
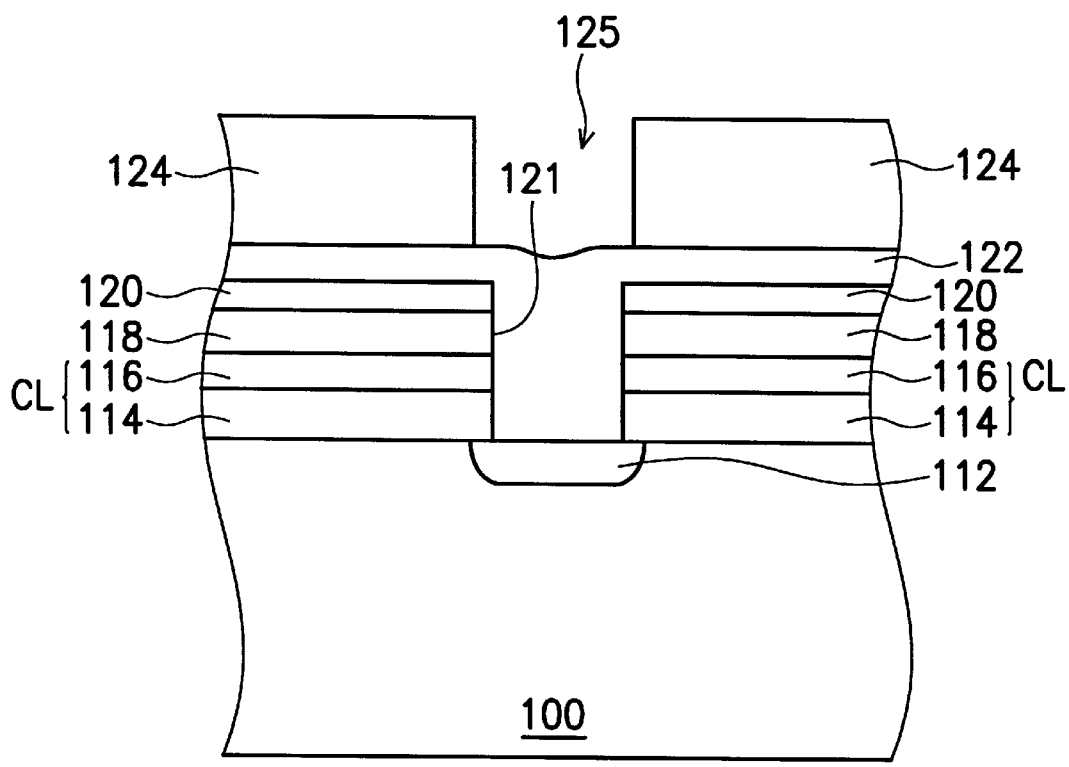

Referring now to FIG. 2D, an oxide layer 122, preferably borophosphosilicate glass (BPSG) layer, is deposited by chemical vapor deposition (CVD) to fill into the trench 121, extending the upper surface of the first silicon nitride layer 120. Then, a photoresist layer 124 having an opening 125 in a predetermined position is formed by using a photolithography process. An anti-reflection coating (ARC) layer (not shown), for example silicon oxy-nitride, is preferably formed on the oxide layer 122 before forming the photoresist layer 124.

Figure 2E:
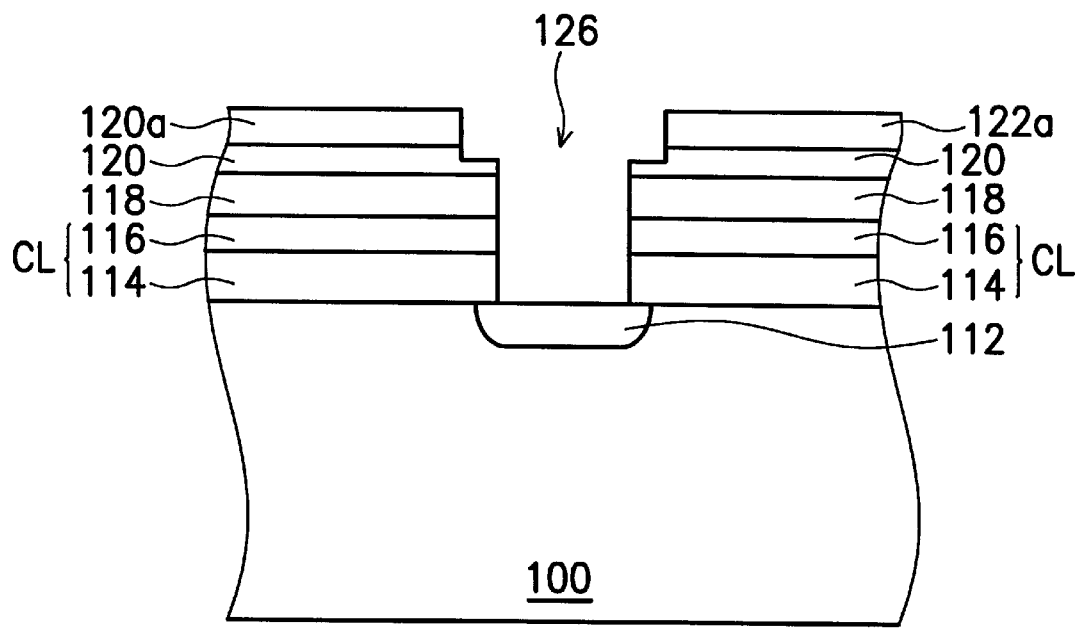

Referring now to FIGS. 2D and 2E, a part of the oxide layer 122 filled into the trench 121 is removed using the photoresist layer 124 as the etching mask, thereby forming a self-aligned contact hole 126, exposing the conductive region 112 and leaving the oxide layer 122a. In this step, a part of the first silicon nitride layer 120 is removed. Afterward, the photoresist layer 124 is removed.

Figure 2F:
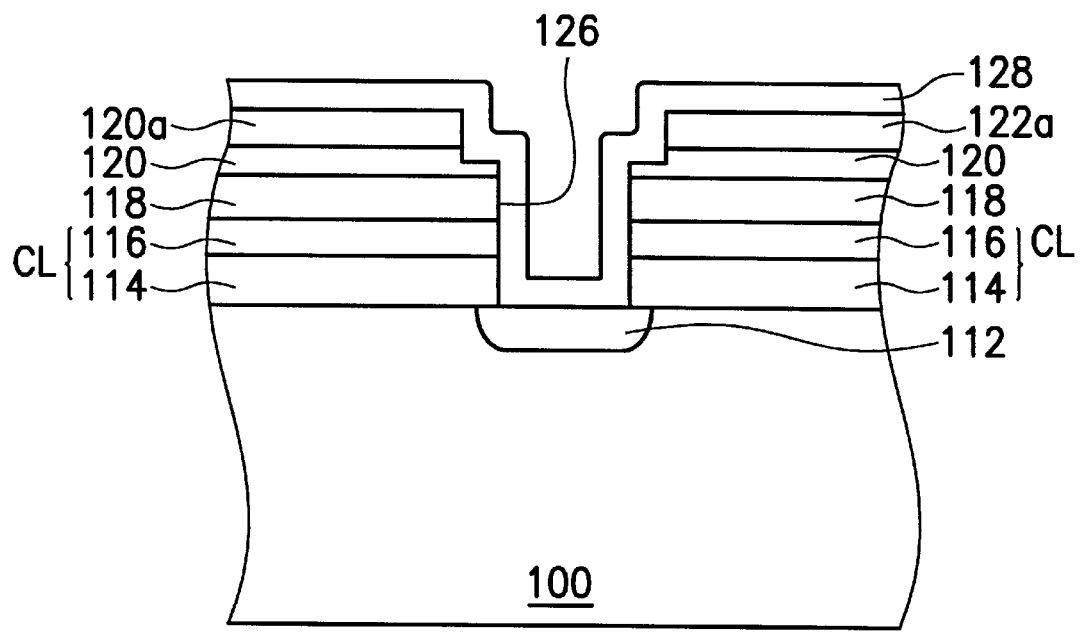

Next, as shown in FIG. 2F, a second silicon nitride layer 128 is formed on the sidewall of the self-aligned contact hole 126 by using chemical vapor deposition. The second silicon nitride layer 128 extends the upper surface of the oxide layer 122a.

Figure 2G:
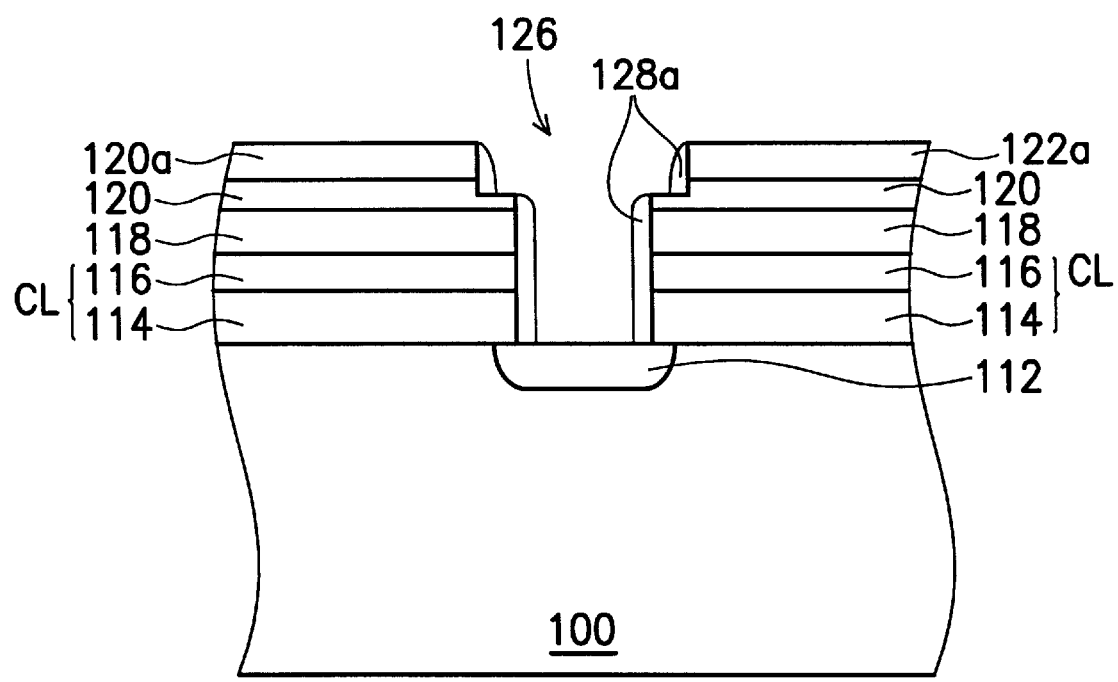

Afterwards, referring to FIG. 2G, the second silicon nitride layer 128 is etched back by anisotropic etching, thereby forming a silicon nitride spacer 128a which can be used as an insulated element. Then, a DRAM capacitor (not shown) is formed in the self-aligned contact hole 126 containing the spacer 128a by the conventional method.

The process of this invention eliminates problems caused by a narrow trench slit.

Moreover, the thickness of first silicon nitride layer 120 can be decreased because the silicon oxide layer 118 has the function of an etching stop layer while the silicon nitride layer 128 is etched. As a result, the thermal budget can be reduced.

What is claimed is:

1. A method for fabricating a self-aligned contact hole, comprising the steps of:
   (a) sequentially forming a conductive layer, a silicon oxide layer, and a first silicon nitride layer on a semiconductor substrate which has a conductive region;
   (b) selectively etching said first silicon nitride layer, said silicon oxide layer, and said conductive layer to form a trench, thereby exposing said conductive region;
   (c) forming an oxide layer over said first silicon nitride layer, said oxide layer filling into said trench;
   (d) defining a photoresist layer which has an opening in a predetermined position;
   (e) completely removing said oxide layer inside said trench to form a self-aligned contact hole by using said photoresist layer as the masking layer, wherein a part of said first silicon nitride layer is removed;
   (f) removing the photoresist layer; and
   (g) forming a silicon nitride spacer on the sidewall of said self-aligned contact hole;
   wherein said self-aligned contact hole increases the exposed area of said conductive region.

2. A method for fabricating a self-aligned contact hole as claimed in claim 1, wherein said conductive region is a source/drain region.

3. A method for fabricating a self-aligned contact hole as claimed in claim 1, wherein said semiconductor substrate is a silicon substrate.

4. A method for fabricating a self-aligned contact hole as claimed in claim 1, wherein said conductive layer comprises a polysilicon layer and a polycide layer.

5. A method for fabricating a self-aligned contact hole as claimed in claim 1, wherein said oxide layer in step (c) is a borophosphosilicate glass (BPSG) layer.

6. A method for fabricating a self-aligned contact hole as claimed in claim 5, wherein said borophosphosilicate glass (BPSG) layer is formed by chemical vapor deposition (CVD).

7. A method for fabricating a self-aligned contact hole as claimed in claim 1, further comprising a step of forming an anti-reflection coating (ARC) layer on a surface of said oxide layer before step (d).

8. A method for fabricating a self-aligned contact hole as claimed in claim 7, wherein said anti-reflection coating layer is silicon oxy-nitride layer.

9. A method for fabricating a self-aligned contact hole as claimed in claim 1, wherein said conductive layer is used as a gate electrode.

10. A method for fabricating a self-aligned contact hole as claimed in claim 1, wherein said silicon nitride spacer is formed by the steps of:
    forming a second silicon nitride layer by chemical vapor deposition; and
    etching back said second silicon nitride layer to form a spacer.

11. A method for fabricating a self-aligned contact hole as claimed in claim 1, wherein said first silicon nitride layer has a thickness of somewhere between 400 and 900 Angstroms.

12. A method for fabricating a self-aligned contact hole as claimed in claim 11, wherein said first silicon nitride layer has a thickness of somewhere between 500 and 600 Angstroms.

13. A method for fabricating a self-aligned contact hole, comprising the steps of:
    (a) sequentially forming a gate electrode conductive layer, a silicon oxide layer, and a first silicon nitride layer on a silicon substrate which has a source/drain region;
    (b) selectively etching said first silicon nitride layer, said silicon oxide layer, and said gate electrode conductive layer to form a trench, thereby exposing said source/drain region;
    (c) forming a BPSG layer over said first silicon nitride layer, said BPSG layer filling into said trench;
    (d) defining a photoresist layer which has an opening in a predetermined position;
    (e) completely removing said BPSG layer inside said trench to form a self-aligned contact hole by using said photoresist layer as the masking layer wherein a part of said first silicon nitride layer is removed;
    (f) removing the photoresist layer; and
    (g) depositing a second silicon nitride layer on the sidewall and bottom of said self-aligned hole; and
    (h) etching back the second silicon nitride layer to form a silicon nitride spacer;
    wherein said self-aligned contact hole increases the exposed area of said conductive region.

14. A method for fabricating a self-aligned contact hole as claimed in claim 13, wherein said gate electrode conductive layer consists of a polysilicon layer and a polycide layer.

15. A method for fabricating a self-aligned contact hole as claimed in claim 13, wherein said BPSG layer is formed by chemical vapor deposition.

* * * * *